(12) United States Patent
Ha et al.

(10) Patent No.: US 8,367,585 B2
(45) Date of Patent: Feb. 5, 2013

(54) SUPERCONDUCTING STRIP HAVING METAL COATING LAYER AND METHOD OF MANUFACTURING THE SAME

(75) Inventors: Hong Soo Ha, Changwon-si (KR); Sang Soo Oh, Changwon-si (KR); Dong Woo Ha, Changwon-si (KR); Kyu Jung Song, Changwon-si (KR); Rock Kil Ko, Gimhae-si (KR); Ho Sup Kim, Gimhae-si (KR)

(73) Assignee: Korea Electrotechnology Research Institute (KR)

( * ) Notice: Subject to any disclaimer, the term of this patent is extended or adjusted under 35 U.S.C. 154(b) by 1102 days.

(21) Appl. No.: 12/177,749

(22) Filed: Jul. 22, 2008

(65) Prior Publication Data

US 2009/0111700 A1    Apr. 30, 2009

(30) Foreign Application Priority Data

Oct. 31, 2007  (KR) .................. 10-2007-0110238

(51) Int. Cl.
*H01L 39/24* (2006.01)
*H01L 39/14* (2006.01)
*H01B 13/00* (2006.01)

(52) U.S. Cl. ........ 505/430; 505/433; 505/490; 505/704; 505/230; 174/125.1; 29/599; 427/62; 427/266

(58) Field of Classification Search ............... 505/230, 505/231, 430, 433, 470, 472, 704, 705; 174/125.1; 29/599; 427/62; 428/457, 544, 688
See application file for complete search history.

(56) References Cited

U.S. PATENT DOCUMENTS

| | | | |
|---|---|---|---|
| 6,365,554 B1 * | 4/2002 | Thompson et al. | 505/434 |
| 6,762,673 B1 * | 7/2004 | Otto et al. | 338/32 S |
| 2003/0130128 A1 * | 7/2003 | Han | 505/100 |
| 2004/0266628 A1 * | 12/2004 | Lee et al. | 505/238 |
| 2005/0028347 A1 * | 2/2005 | Maher | 29/592.1 |
| 2007/0057017 A1 * | 3/2007 | Kim et al. | 228/101 |

FOREIGN PATENT DOCUMENTS

| | | |
|---|---|---|
| JP | 2000-030929 * | 1/2000 |
| JP | 2003-212669 A | 7/2003 |
| JP | 2004-143547 A | 5/2004 |
| KR | 10-0122105 B1 | 9/1997 |
| KR | 10-2004-0060228 A | 7/2004 |
| KR | 10-0750664 B1 | 8/2007 |
| KR | 10-2007-0093702 A | 9/2007 |

* cited by examiner

*Primary Examiner* — Stanley Silverman
*Assistant Examiner* — Kallambella Vijayakumar
(74) *Attorney, Agent, or Firm* — Park & Associates IP Law, P.C.

(57) ABSTRACT

Disclosed herein is a superconducting strip having a metal coating layer and a method of manufacturing the superconducting strip. The method of manufacturing the superconducting strip includes: washing a superconducting thin film, a stabilizing substrate and an anti-bonding substrate with alcohol; forming a metal coating layer on each of the superconducting thin film and stabilizing substrate; adhering the superconducting thin film and stabilizing substrate to each other such that the metal coating layer formed on the superconducting thin film faces the metal coating layer formed on the stabilizing substrate; disposing the anti-bonding substrate on an outside of the stabilizing substrate and then winding the anti-bonding substrate such that the anti-bonding substrate and the stabilizing substrate are closely adhered to each other by winding the anti-bonding substrate around a bobbin under a predetermined tension; and heat-treating the superconducting thin film and stabilizing substrate such that they are bonded to each other by the metal coating layer disposed therebetween.

6 Claims, 4 Drawing Sheets

(a)　　　　　　　　　　　　　(b)

(c)　　　　　　　　　　　　　(d)

(e)

SUPERCONDUCTING STRIP HAVING METAL COATING LAYER AND METHOD OF MANUFACTURING THE SAME

FIELD OF THE INVENTION

The present invention relates to a superconducting strip having a metal coating layer and a method of manufacturing the same, and, more particularly, to a superconducting strip in which a superconducting thin film and a stabilizing substrate, which are wound in a pancake shape, are easily bonded to each other using a metal coating layer, a neutral axis can be adjusted depending on the bending stress of the superconducting thin film, and a thick stabilizing substrate can also be rapidly bonded to the superconducting thin film, and to a method of manufacturing the same.

BACKGROUND OF THE INVENTION

Generally, superconductors enable a large amount of current to flow without loss, and can be used to make strong magnets, and thus they are applied in various fields, such as magnetic levitation trains, MRI systems, etc. Moreover, superconductors can be used to develop extremely fast, efficient and sensitive sensors and electronic devices, which cannot be realized using conventional devices.

Among such superconductors, a high-temperature superconductor, made of BSCCO (bismuth strontium calcium copper oxide) or YBCO (yttrium barium copper oxide), exhibits superconductivity even at a temperature lower than a boiling point (77 K) of liquefied nitrogen ($LN_2$). Therefore, a high-temperature superconductor is advantageous in that it can be cooled using liquefied nitrogen as a coolant at low cost, compared to a low-temperature superconductor cooled using liquefied helium (LHe) as a coolant.

However, since a high-temperature superconductor exists as an oxide, it has insufficient ductility and is easily damaged, thus weakening the flow of current. Therefore, methods of using the high-temperature superconductor in the form of a superconducting wire have been researched.

In the superconducting wire, since a superconductor and a stabilizing substrate are bonded to each other, when current equal to or greater than critical current is applied to the superconductor, it passes to the stabilizing substrate, and thus the superconducting wire is protected.

Here, methods of forming a stabilizing layer may include a powder filling method, a vacuum thin film deposition method, and the like.

Korean Patent No. 10-0122105, registered on Sep. 2, 1997, discloses a method of manufacturing a high-temperature superconducting strip using the filling pressure of refractory powder through a hot working process.

FIG. 1 is a process view showing a conventional method of manufacturing a high-temperature superconducting strip using the filling pressure of refractory powder through a hot working process.

First, a superconducting strip is formed by putting bismuth-based powder into a silver tube and then drawing and rolling the bismuth-based powder. As shown in FIG. 1A, the superconducting strip is cut to a desired length, and then the cut pieces of superconducting strip are temporarily layered in a desired number. Then, as shown in FIG. 1B, the temporarily layered superconducting strips are covered with an adhesive strip, which is a very thin organic adhesive. This adhesive strip serves to stably maintain superconducting strips in a desired form while the superconducting strips are temporarily layered in a thickness direction.

Subsequently, as shown in FIG. 1C, the temporarily multi-layered superconducting strips are spirally disposed in a container, and are buried in powder compressed using a press, to conduct hot work. Then, as shown in FIG. 1D, the surface of the powder is pressed, and thus three-dimensional pressure occurs, thereby forming pressure for layering or contacting the superconducting strips.

Finally, as shown in FIG. 1E, the superconducting strips disposed in the container are directly put into a heating furnace where the strips are bonded to each other through a hot working process.

The superconducting strip manufactured using the above method is advantageous in that it has high critical current density, but is problematic in that an expensive silver tube must be used to manufacture the superconducting strip, it takes a lot of time to manufacture the superconducting strip, and the manufacturing cost thereof is high.

In order to overcome the above problem, technologies of manufacturing a superconducting strip by depositing Ag or Au on a superconducting layer and then soldering a stabilizing substrate (Cu) thereto have been proposed.

Korean Patent No. 10-0750664, registered Aug. 13, 2007, discloses an apparatus for continuously laminating superconducting strips by applying compressive stress thereto.

As shown in FIG. 2, a superconducting strip 10 is passed through a solder supply unit 200 which holds melted solder, and thus solder is adhered to the superconducting strip 10. The superconducting strip 10, on which solder is adhered, passes through a preheating unit 300 together with two reinforcement strips 20 to be preheated to a predetermined temperature.

The preheated superconducting strip 10 and reinforcement strips 20 pass through a tension control press 400 where they are pressed and thus bonded with each other by the solder disposed therebetween. The tension control press 400 is configured to control tension such that the tension of the reinforcement strips 20 is greater than that of the superconducting strip 10. Consequently, the superconducting sheet 30, which is manufactured under the condition of causing tension difference, is subjected to compressive stress over the entire region. That is, since the reinforcement strips 20 are bonded with the superconducting strip 10 in a state in which they are stretched, compressive stress is also applied to the superconducting strip in the same amount as tensile stress applied to the reinforcement strips 20.

This method of manufacturing a superconducting sheet by bonding a superconducting strip 10 with reinforcement strips 20 using solder is advantageous in that the manufacturing cost thereof can be decreased, and the damage to a superconducting layer in the superconducting sheet can be minimized because compressive stress is applied to the entire superconducting sheet, but is problematic in that a stabilizing substrate is detached from the superconducting strip at the time of heat-treatment due to the melted solder, and the superconducting strip is heated at the time of soldering.

In addition, a method of manufacturing a superconducting sheet by coating a superconducting thin film with a metal, such as silver (Ag), etc., and then completely covering the superconducting thin film with copper (Cu) through a wet-plating process is proposed. The method is advantageous in that, since the superconducting thin film is completely covered, it is hardly damaged and its thickness can be easily adjusted, but is problematic in that environmental pollution problems occur and process costs increase because a wet-plating process is additionally conducted, it takes a lot of time to deposit a thick superconducting thin film, and the superconducting thin film cannot be wound at various curvatures.

SUMMARY OF THE INVENTION

Accordingly, the present invention has been made keeping in mind the above problems occurring in the prior art, and an object of the present invention is to provide a superconducting strip having a metal coating layer, in which a stabilizing substrate is rapidly bonded to a superconducting thin film, which causes almost no environmental problems, and which can decrease the process time and cost, and to a method of manufacturing the same.

Another object of the present invention is to provide a superconducting strip having a metal coating layer which can prevent superconductive properties from being deteriorated regardless of various curvature stresses.

In order to accomplish the above object, an aspect of the present invention provides a method of manufacturing a superconducting strip using a metal coating layer, including: washing a superconducting thin film, a stabilizing substrate and an anti-bonding substrate with alcohol; forming a metal coating layer on each of the superconducting thin film and stabilizing substrate; adhering the superconducting thin film and stabilizing substrate to each other such that the metal coating layer formed on the superconducting thin film faces the metal coating layer formed on the stabilizing substrate; disposing the anti-bonding substrate on an outside of the stabilizing substrate and then winding the anti-bonding substrate such that the anti-bonding substrate and the stabilizing substrate are closely adhered to each other by winding the anti-bonding substrate around a bobbin under a predetermined tension; and heat-treating the superconducting thin film and stabilizing substrate such that they are bonded to each other by the metal coating layer disposed therebetween.

In the method, the stabilizing substrate may be made of SUS, Cu or Cu alloy.

In the method, the metal coating layer may be made of any one selected from among Ag, Au, and Pt.

In the method, the bobbin may be provided thereon with a post having a diameter of 20~1000 mm, and the superconducting thin film, stabilizing substrate and anti-bonding substrate may be sequentially wound around the post.

In the method, the superconducting thin film may be made of REBCO (Re—Ba—Cu—O)-based oxide or BSCCO (Bi—Sr—Ca—Cu—O)-based oxide, and Re may include Y and rare-earth metals (Pr, Nd, Pm, Sm, Eu, Gd, Tb, Dy, Ho, Er, Tm, Yb, Lu).

In the method, the heat-treatment may be conducted at a temperature of 300~700° C. in an oxygen atmosphere (100%, 1 atm) for 1 hour or more.

Further, another aspect of the present invention provides a superconducting strip, including: a superconducting thin film wound on a cylindrical bobbin at a predetermined tension;

a stabilizing substrate wound on an outer surface of the superconducting thin film at a predetermined tension; a metal coating layer formed on one side of each of the superconducting thin film and stabilizing substrate; and an anti-bonding substrate wound on an outer surface of the stabilizing substrate at a predetermined tension, wherein the superconducting thin film is bonded to the stabilizing substrate by winding the anti-bonding substrate under a predetermined tension and then heat-treating the superconducting thin film, stabilizing substrate and anti-bonding substrate.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Figure 1:
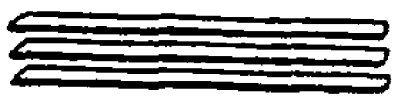
FIG. 1 is a process view showing a conventional method of manufacturing a high-temperature superconducting strip using the filling pressure of refractory powder through a hot working process.
Figure 1:
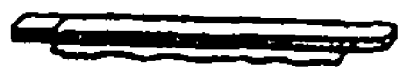
Figure 1:
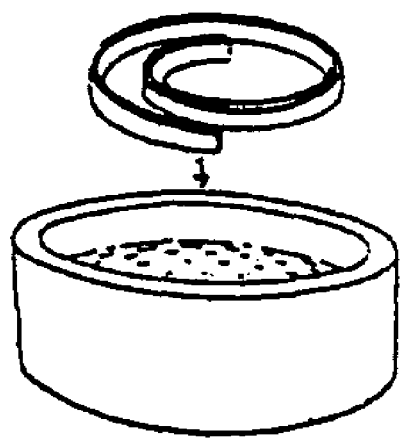
Figure 1:
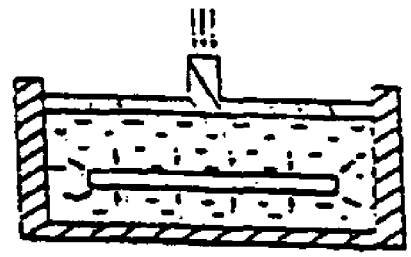
Figure 1:
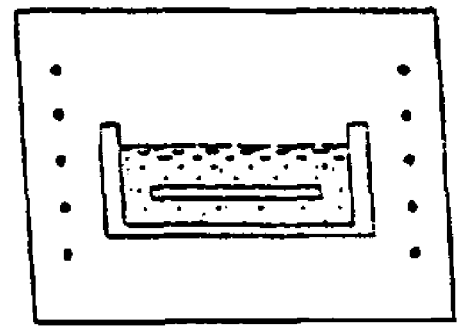
Figure 2:
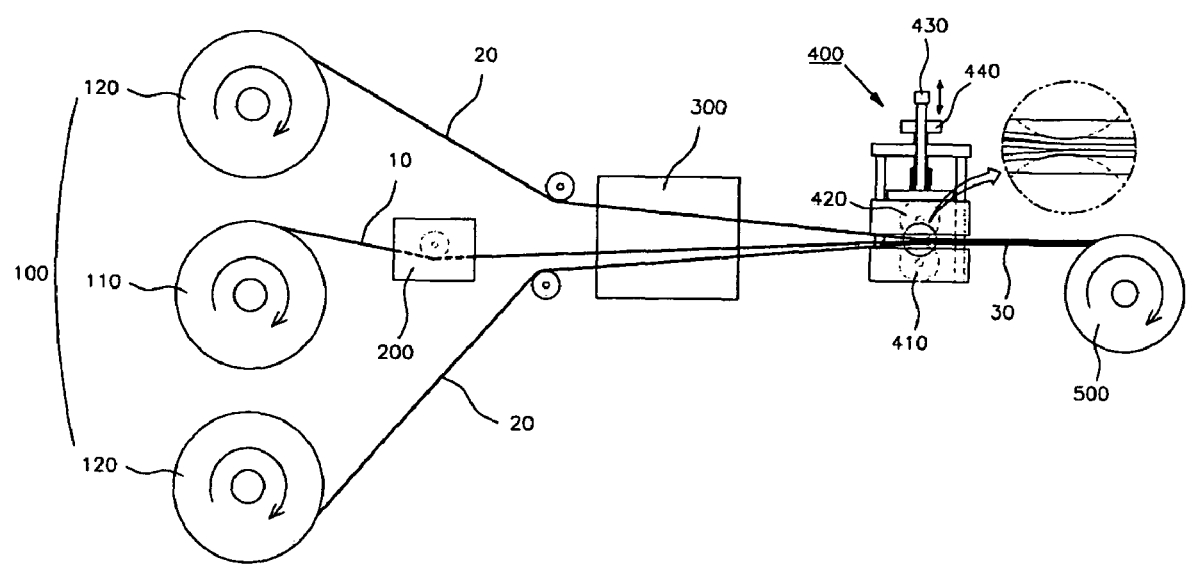
FIG. 2 is a front view showing a conventional apparatus for continuously laminating a superconducting strip by applying compressive stress thereto.

Hereinafter, preferred embodiments of the present invention will be described in detail with reference to the attached drawings.

Reference now should be made to the drawings, in which the same reference numerals are used throughout the different drawings to designate the same or similar components.

Figure 3:
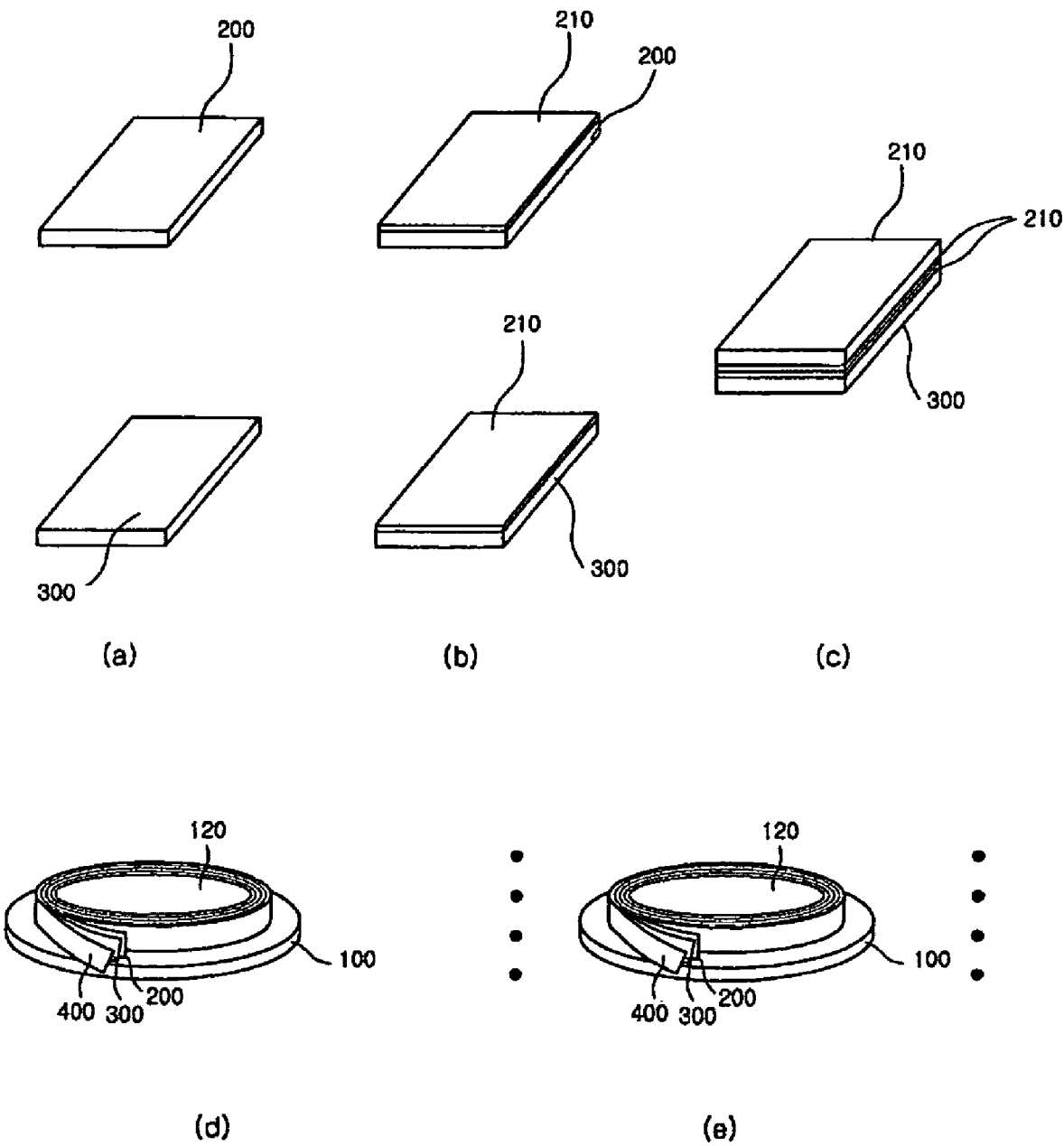
FIG. 3 is a process view showing a method of manufacturing a superconducting strip using a metal coating layer according to the present invention.

FIG. 3 is a process view showing a method of manufacturing a superconducting strip using a metal coating layer according to the present invention.

First, as shown in FIG. 3A, a superconducting thin film 200, a stabilizing substrate 300 and an anti-bonding substrate 400 are washed with alcohol to remove impurities therefrom.

Second, as shown in FIG. 3B, a very thin metal coating layer 210 is formed on each of the superconducting thin film 200 and stabilizing substrate 300 to bond the superconducting thin film 200 and stabilizing substrate 300 to each other through subsequent heat treatment. This metal coating layer serves as a precursor of the stabilizing substrate 300.

Here, the superconducting thin film 200 may be made of REBCO (Re—Ba—Cu—O)-based oxide or BSCCO (Bi—Sr—Ca—Cu—O)-based oxide, and Re includes Y and rare-earth metals (Pr, Nd, Pm, Sm, Eu, Gd, Tb, Dy, Ho, Er, Tm, Yb, Lu). Further, the stabilizing substrate 300 may be made of SUS, Cu or Cu alloy, and the metal coating layer 210 may be made of any one selected from among high thermal conductivity metals, such as Ag, Au, Pt, and the like.

The stabilizing substrate 300 serves to enable current greater than critical current to flow therethrough, when the superconducting thin film 200 is unstable so that the current flowing through the superconducting thin film 200 reaches critical current, with the result that no current flows therethrough anymore.

Further, the stabilizing substrate 300 transfers the heat emitted from the superconducting thin film 200 to a coolant, so that the superconducting thin film 200 is cooled, with the result that the superconducting thin film 200 returns to a superconductive state, thereby enabling current to flow through the superconducting thin film 200.

Third, as shown in FIG. 3C, the superconducting thin film 200 and stabilizing substrate 300 are closely adhered to each other such that the metal coating layer 210 formed on the superconducting thin film 200 faces the metal coating layer 210 formed on the stabilizing substrate 300.

Fourth, as shown in FIG. 3D, the superconducting thin film 200, stabilizing substrate 300 and anti-bonding substrate 400 are sequentially wound around a post 120 of a bobbin 100.

That is, the bobbin 100 is provided thereon with the post 120 having a diameter of 20~1000 mm, and the superconducting thin film 200, stabilizing substrate 300 and anti-bonding substrate 400 are sequentially wound around the post 120.

Here, the anti-bonding substrate 400 serves to prevent the previously wound superconducting thin film 200 and stabilizing substrate 300 and the subsequently wound superconducting thin film 200 and stabilizing substrate 300 from being bonded to each other.

Further, since the curvature of the superconducting thin film 200 to be wound around the post 120 of the bobbin 100 can be freely changed by controlling the neutral axis thereof depending on the bending stress of the superconducting thin film 200, the superconducting thin film 200 and stabilizing substrate 300 can be shaped in various curvatures.

As such, since the superconducting thin film 200 and stabilizing substrate 300 are deformed into the roll shape before heat treatment, the loss and deformation of the superconducting thin film 200, which may occur while the superconducting thin film 200 is wound after heat treatment, can be prevented, and deterioration in the superconductive properties of the superconducting thin film 200 can also be prevented.

Further, the anti-bonding substrate 400 is wound while being subjected to a winding force stronger than the winding force applied to the superconducting thin film 200 and stabilizing substrate, and thus compressive stress is strongly applied to the superconducting thin film 200 and stabilizing substrate 300 disposed inside the anti-bonding substrate 400.

Finally, fifth, as shown in FIG. 3E, the superconducting thin film 200, stabilizing substrate 300 and anti-bonding substrate are heat-treated at a temperature of 500° C. in an oxygen atmosphere (100%, 1 atm) for 1 hour or more, so as to bond the superconducting thin film 200 and stabilizing substrate 300 to each other through the hot working process.

Figure 4:
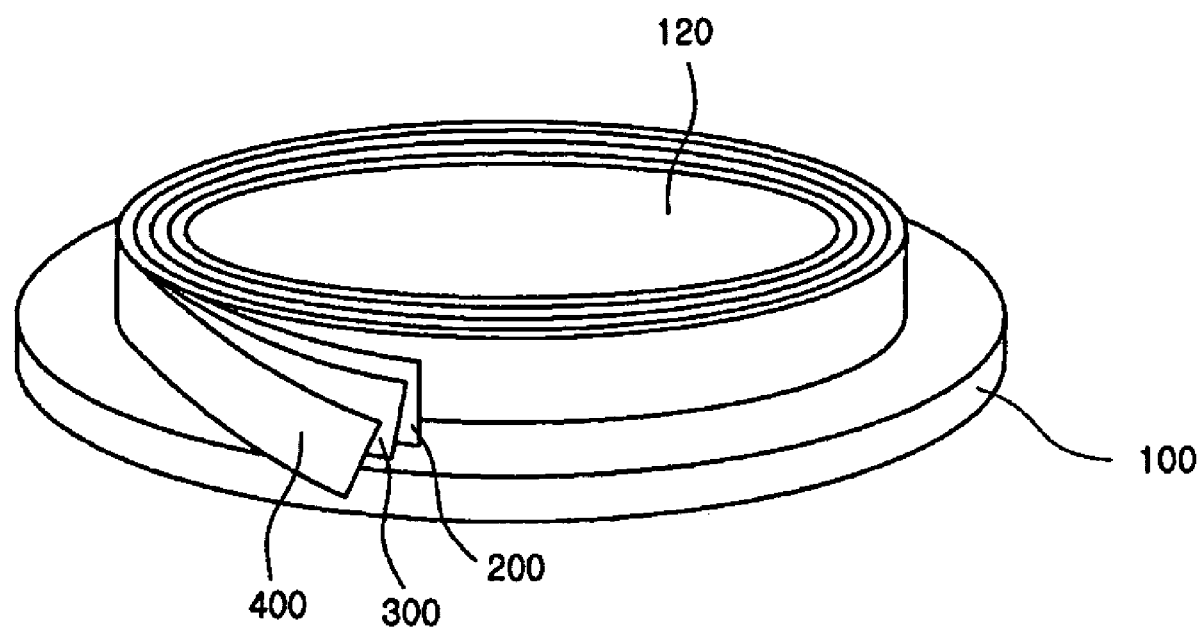
FIG. 4 is a perspective view showing a superconducting strip structure having a metal coating layer according to the present invention.

FIG. 4 is a perspective view showing a superconducting strip having a metal coating layer according to the present invention.

As shown in FIG. 4, the superconducting strip, manufactured using the above method, includes a superconducting thin film 200, a stabilizing substrate 300 and an anti-bonding substrate 400, which are wound on a bobbin 100 for heat treatment.

The bobbin 100 for heat treatment has a low cylindrical shape, and is provided thereon with a cylindrical post 120.

Here, the post 120 formed on the bobbin 100 may have a diameter of about 300 mm, and the peripheral surface of the post 120 of the bobbin 100 is formed such that the superconducting thin film 200, stabilizing substrate 300 and anti-bonding substrate 400 are sequentially wound thereon.

The superconducting thin film 200 is made of REBCO (Re—Ba—Cu—O)-based oxide or BSCCO(Bi—Sr—Ca—Cu—O)-based oxide, and Re includes Y and rare-earth metals (Pr, Nd, Pm, Sm, Eu, Gd, Tb, Dy, Ho, Er, Tm, Yb, Lu). Further, the superconducting thin film 200 may have a thickness of 0.01~0.09 mm.

The stabilizing substrate 300 is made of nonmagnetic stainless steel, Ni alloy or Cu alloy, has a thickness of 0.01~0.09 mm, and has the same width as the superconducting thin film 200.

Because the superconducting thin film 200 loses its superconductive properties when it is heated or excess current flows therethrough due to magnetic flux, the stabilizing substrate 300 enables the superconducting thin film 200 to maintain the superconductive properties thereof by allowing heat and current in the superconducting thin film 200 to be transferred to the stabilizing substrate 300, thus cooling the superconducting thin film 200.

Each of the superconducting thin film 200 and stabilizing substrate 300 is coated with a metal by sputtering to form a metal coating layer 210, and is then wound around the post 120 of the bobbin 100 together with an anti-bonding substrate 400.

The metal coating layer 210 is made of any one selected from among Ag, Au, and Pt, and is formed on each of the superconducting thin film 200 and stabilizing substrate 300 to have a thickness of about 0.5 μm.

The anti-bonding substrate 400 is made of a conductive metal and is disposed outside the superconducting thin film 200 and stabilizing substrate 300. The anti-bonding substrate 400 serves to prevent the previously wound superconducting thin film 200 and stabilizing substrate 300 and the subsequently wound superconducting thin film 200 and stabilizing substrate 300 from being bonded to each other when it is wound once and then wound again. Further, even in the heat treatment using oxygen, since the anti-bonding substrate 400 does not have a metal coating layer 210, the anti-bonding substrate 400 is not bonded to the stabilizing substrate 300, and causes the superconducting thin film 200 and the stabilizing substrate 300 to be wound on the post 120 of the bobbin 100 under the high stress.

In this case, since the tension applied to the anti-bonding substrate 400 is relatively stronger than the tension applied to the superconducting thin film 200 or the stabilizing substrate 300, compressive and tensile stresses are induced to the superconducting thin film 200 and the stabilizing substrate 300, so that strong stress acts throughout the superconducting thin film 200 and the stabilizing substrate 300, with the result that the superconducting thin film 200 is bonded to the stabilizing substrate 300 using the metal coating layer 210 at the time of heat treatment using oxygen.

Further, regardless of thickness of the stabilizing substrate 300, the superconducting thin film 200 and the stabilizing substrate 300 can be rapidly bonded to each other using the metal coating layer 210, by winding and the superconducting thin film 200 and the stabilizing substrate 300 and then heat-treating them.

As described above, the present invention is advantageous in that a superconducting thin film, a stabilizing substrate and an anti-bonding substrate are wound in a pancake shape and are then heat-treated, and thus any of stabilizing substrates having various thicknesses can be rapidly bonded to the superconducting thin film using a metal coating layer, thereby decreasing process time.

Further, the present invention is advantageous in that superconducting strips having various curvatures can be formed by freely adjusting the neutral axis thereof, and the deterioration in the superconductive properties of the superconducting strip due to the deformation thereof can be prevented by winding a superconducting thin film prior to heat treatment.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a superconducting strip, comprising:
   washing a superconducting thin film, a stabilizing substrate and an anti-bonding substrate;
   forming a metal coating layer on each of the superconducting thin film and stabilizing substrate;

adhering the superconducting thin film and stabilizing substrate to each other such that the metal coating layer formed on the superconducting thin film faces the metal coating layer formed on the stabilizing substrate;

winding the anti-bonding substrate on an outside of the stabilizing substrate such that the anti-bonding substrate and the stabilizing substrate are closely adhered to each other by winding the anti-bonding substrate around a bobbin under a predetermined tension; and heat-treating the superconducting thin film, stabilizing substrate and anti-bonding substrate, so as to bond the superconducting thin film and stabilizing substrate to each other by the metal coating layer disposed therebetween.

2. The method of manufacturing a superconducting strip according to claim 1, wherein the stabilizing substrate is made of SUS, Cu or Cu alloy.

3. The method of manufacturing a superconducting strip according to claim 1, wherein the metal coating layer is made of any one selected from among Ag, Au, and Pt.

4. The method of manufacturing a superconducting strip according to claim 1, wherein the bobbin is provided thereon with a post, and the superconducting thin film, stabilizing substrate and anti-bonding substrate are sequentially wound around the post.

5. The method of manufacturing a superconducting strip according to claim 1, wherein the superconducting thin film is made of REBCO(Re-Ba-Cu-0)-based oxide or BSCCO(Bi-Sr-Ca-Cu-O)-based oxide, and Re includes Y and rare-earth metals.

6. The method of manufacturing a superconducting strip according to claim 1, wherein the heat-treatment is conducted at a temperature of 300~700°C. in an oxygen atmosphere.

* * * * *